(12) United States Patent
Yanagisawa et al.

(10) Patent No.: US 6,683,447 B1
(45) Date of Patent: Jan. 27, 2004

(54) ELECTRO-OPTIC APPARATUS FOR MEASURING SIGNAL POTENTIALS

(75) Inventors: Yoshiki Yanagisawa, Tokyo (JP); Nobuaki Takeuchi, Tokyo (JP); Jun Kikuchi, Tokyo (JP); Yoshio Endou, Tokyo (JP); Mitsuru Shinagawa, Tokyo (JP); Tadao Nagatsuma, Tokyo (JP); Kazuyoshi Matsuhiro, Tokyo (JP)

(73) Assignees: Ando Electric Co., Ltd., Tokyo (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/167,302

(22) Filed: Oct. 6, 1998

(30) Foreign Application Priority Data

Oct. 6, 1997 (JP) ............................................. 9-273154

(51) Int. Cl.⁷ ...................... G01R 19/00; G01R 13/20; G01R 23/00; G02F 1/01
(52) U.S. Cl. ........................ 324/96; 324/121; 324/72; 250/227.17
(58) Field of Search ......................... 324/72, 72.5, 96, 324/121 R, 158.1, 76.36, 244.1, 752, 753; 385/12; 356/369; 250/227.14, 227.17, 231.1

(56) References Cited

U.S. PATENT DOCUMENTS

| | | | | |
|---|---|---|---|---|
| 4,446,425 A | * | 5/1984 | Valdmanis et al. | 324/96 X |
| 4,618,819 A | * | 10/1986 | Mourou et al. | 324/96 X |
| 4,906,922 A | * | 3/1990 | Takahashi et al. | 324/96 X |
| 5,126,660 A | * | 6/1992 | Harvey et al. | 324/96 X |
| 5,126,661 A | * | 6/1992 | Harvey et al. | 324/96 X |

FOREIGN PATENT DOCUMENTS

| | | |
|---|---|---|
| EP | 197 196 | 10/1986 |
| EP | 244 248 | 11/1987 |
| JP | 5-81728 | 11/1993 |
| JP | 9-211035 | 8/1997 |
| WO | WO 83/02829 | 8/1983 |

OTHER PUBLICATIONS

"Novel High–Impedance Probe for Multi–Gigahertz Signal Measurement" 1995 IEEE Instrumentation and Measurement Technology Conference; IMTC/95, Waltham, MA; Apr. 23–26, 1995; pp. 324–328.

* cited by examiner

*Primary Examiner*—Gerard R. Strecker
(74) *Attorney, Agent, or Firm*—Darby & Darby

(57) ABSTRACT

An electro-optic sampling apparatus is provided to enable measurement on potentials of signals on the conductor of coaxial cable with high precision and with ease. Herein, an electric input connector inputs a measured electric signal, which is introduced to a conductive path such as a microstrip line. An electro-optic material (e.g., $Bi_{12}SiO_{20}$) that provides electro-optic effect such as Pockel's effect is fixed to a bare portion of the conductive path and is varied in birefringence ratio in response to strength of electric field caused by the conductive path through which the measured electric signal transmits. The conductive path is then terminated by a terminal device. Now, a laser beam is radiated toward the electro-optic material, wherein it is varied in polarization in response to variations of the birefringence ratio. Then, the laser beam is reflected by a dielectric mirror and is separated into two beams by a polarization beam splitter. Photodiodes are provided to convert the two beams to electric signals representing potentials. Thus, the apparatus measures voltage of the measured electric signal based on the electric signals.

6 Claims, 2 Drawing Sheets

ELECTRO-OPTIC APPARATUS FOR MEASURING SIGNAL POTENTIALS

BACKGROUND OF THE INVENTION

1. Field of the Invention

This invention relates to electro-optic sampling apparatuses that oscilloscopes perform measurements, on measured objects, of electric potentials of signals having high frequencies, (higher than 5 GHz, for example). This application is based on Patent Application No. Hei 9-273154 filed in Japan, the content of which is incorporated herein by reference.

2. Description of the Related Art

Conventionally, oscilloscopes are widely used for measurement of waveforms with regard to rapidly varying electric phenomena. To cope with inspection, maintenance and measurement of information communication systems with increasing communication speeds, it is necessary to perform detection with high precision on electric potentials of signals of measured circuits without imparting disturbances to the measured circuits. However, current technology does not provide probes whose impedance is sufficiently high. So, high-precision oscilloscopes capable of measuring electric potentials of signals having high frequency ranges, which reach 5 GHz, or so, are unavailable.

For instance, a known high-impedance probe enables measurement, without imparting disturbances on, potentials of signals of the measured circuits mounted on printed-circuit boards of information communication systems. This high-impedance probe has a metal rod, or needle tip in contact with a conductive path (e.g., microstrip line). Herein, the metal rod is attached to one end of electro-optic material, which is made of BSO (i.e., $Bi_{12}SiO_{20}$) and to which a dielectric mirror is attached. So, signals on the microstrip line are detected by the metal rod as potentials between the ends of the electro-optic material. Then, the birefringence ratio of light is varied in response to variations of electric field strength corresponding to the detected potentials. Incoming laser beams, which are incident on the electro-optic material, are varied in polarization in accordance with variations of the birefringence ratio. A polarization detection optical system of a probe module extracts such variations in polarization of the laser beams in order to process them. Thus, it is possible to perform measurement of voltages of the signals of the measured circuits.

As described above, the conventional high-impedance probe is capable of measuring voltages of signals having high frequencies, which are higher than 5 GHz or so. Herein, a measurement point corresponds to a "bare" conductive portion such as microstrip line with which the aforementioned metal rod is in "direct" contact. For this reason, a problem with the conventional technology is that it is impossible to directly detect potentials of signals transmitted on a conductor (or core line) of a coaxial cable that provides interconnection between circuits, for example.

In operation, when the metal rod comes into contact with the conductive portion the high-impedance probe may encounter a remarkably high input impedance. So, the conventional technology suffers from a problem as follows:

That it is impossible to perform potential detection with high precision, because measured values become unstable or inaccurate.

SUMMARY OF THE INVENTION

It is an object of the invention to provide an electro-optic sampling apparatus that is capable of measuring potentials of signals transmitted on low-impedance lines such as coaxial cables with high precision and with ease.

According to an electro-optic sampling apparatus of this invention, an electric input connector inputs a measured electric signal, which is introduced to a conductive path such as a microstrip line. An electro-optic material; (e.g., $Bi_{12}SiO_{20}$) that provides an electro-optic effect such as Pockel's effect is fixed to a bare portion of the conductive path and is varied in birefringence ratio in response to strength of electric field generated by the conductive path through which the measured electric signal is transmitted. The conductive path is then terminated by a terminal device. Now, a laser beam is radiated toward the electro-optic material, and it is varied in polarization in response to variations of the birefringence ratio. Then, the laser beam is reflected by a dielectric mirror and is separated into two beams by a polarization beam splitter. Photodiodes are provided to convert the two beams to electric signals representing potentials. Thus, voltage of the measured electric signal from the photodiodes is measured based on the electric signals.

Because the contact area established between the electro-optic material and conductive path is made constant and stabilized so that conduction is made constant correspondingly, it is possible to improve detection precision with respect to potentials.

BRIEF DESCRIPTION OF THE DRAWINGS

These and other objects, aspects and embodiment of the present invention will be described in more detail with reference to the following drawing figures, of which.

DESCRIPTION OF THE PREFERRED EMBODIMENT

Figure 1:
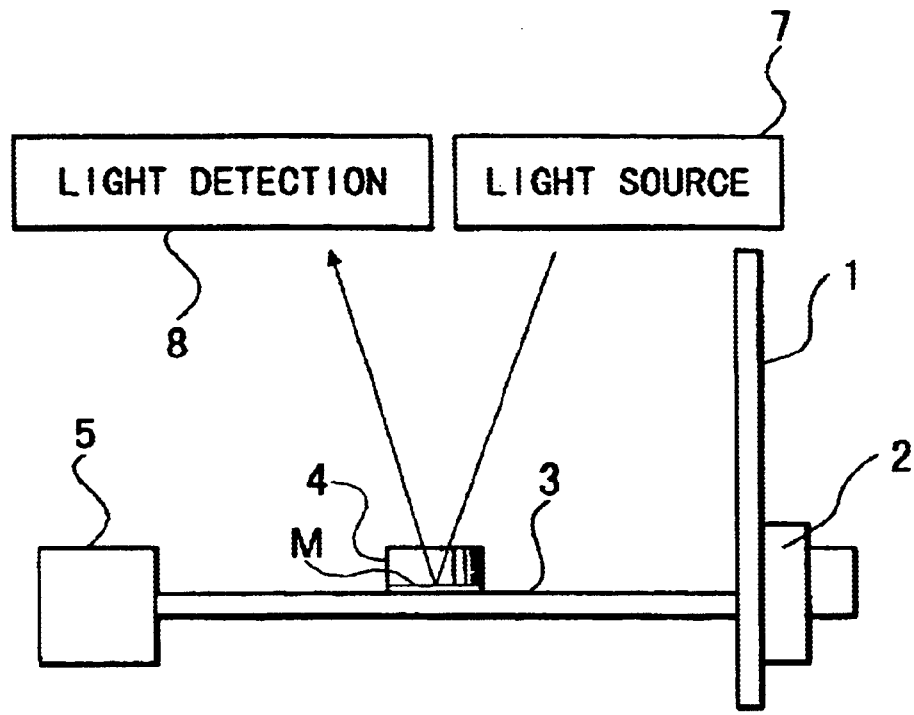
FIG. 1 is a front view showing an electro-optic sampling apparatus in accordance with preferred embodiment of the invention.
Figure 2:
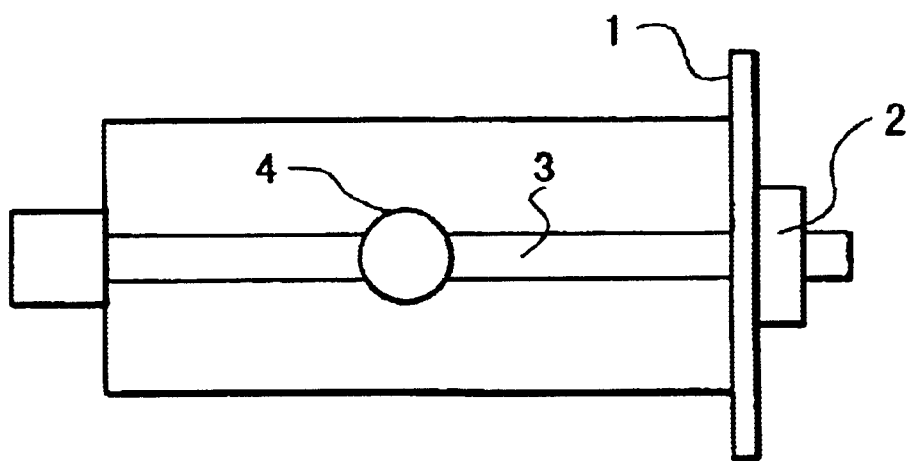
FIG. 2 is a side view showing the electro-optic sampling apparatus of FIG. 1.

This invention will be described in further detail by way of example with reference to the accompanying drawings. FIG. 1 is a front view showing essential parts of an electro-optic sampling apparatus in accordance with the preferred embodiment of the invention. FIG. 2 is a side view showing the electro-optic sampling apparatus. Herein, reference symbol "1" designates a front panel of an oscilloscope, which is equipped with an electric input connector 2 for external input sampling. A conductive path 3 containing a elongated conductor is connected to the electric input connector 2. The conductor is made "bare" along an overall area of the conductive path 3 or at a selected part of the conductive path 3. So, an electro-optic material 4 is fixed in such a way that it is brought into "tight" contact with a bare portion of the conductive path 3 in advance and thus, the conductive path 3, and the electro-optic material 4 are formed as a fixed unit.

Figure 3:
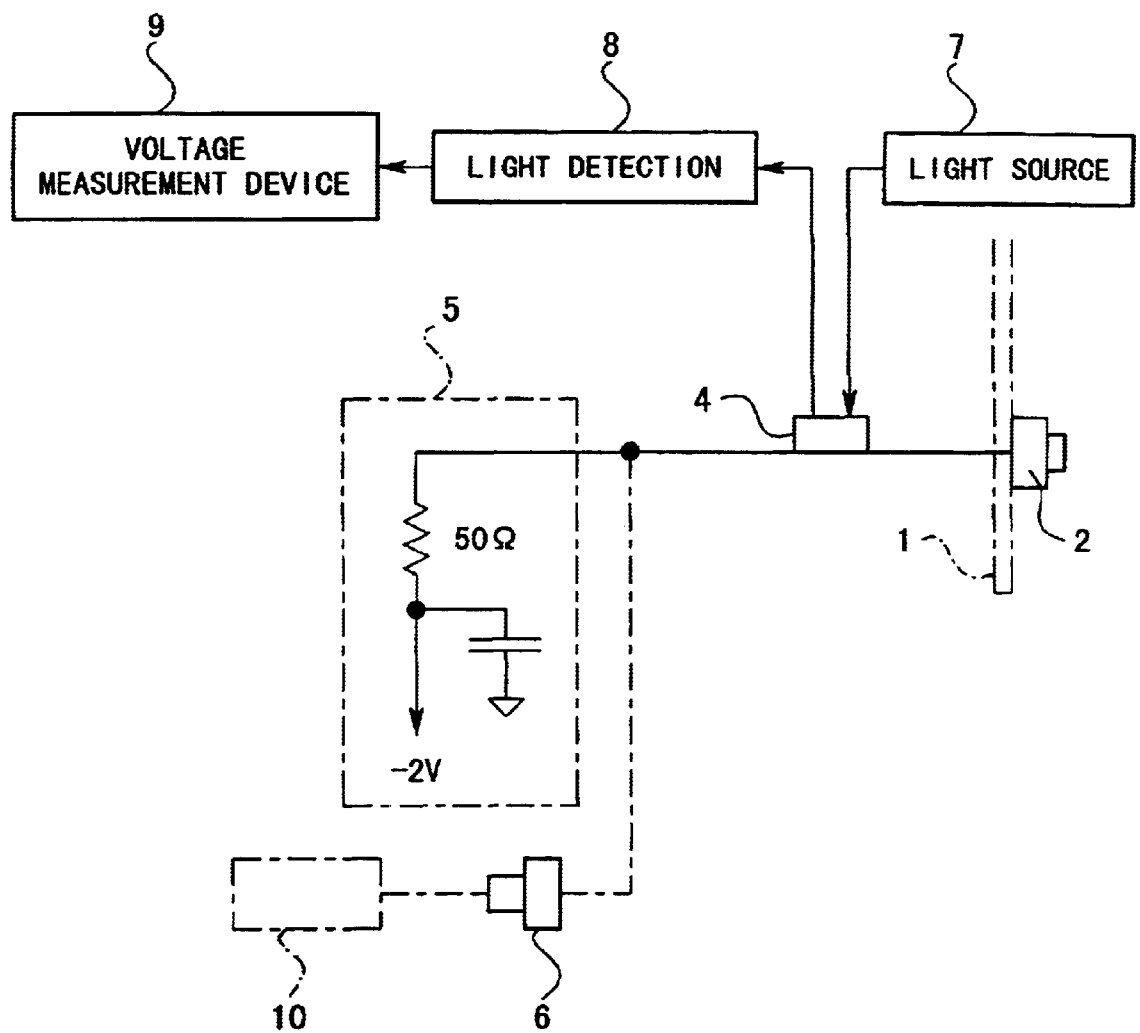
FIG. 3 is a block diagram showing a voltage measurement circuit of the electro-optic sampling apparatus of FIG. 1.

For instance, chemical material of $Bi_{12}SiO_{20}$ is used for the electro-optic material 4. Being influenced by electric field produced by the conductive path 3, the electro-optic material 4 causes Pockel's effect which is an electro-optical effect. Due to the Pockel's effect, the electro-optic material 4 functions to vary birefringence ratio in response to electric field strength. As shown in FIG. 3, laser beams generated by a light source 7 are incident on the electro-optic material 4 under the Pockel's effect. Thus, the laser beam is varied in polarization in response to variations of the birefringence ratio of the electro-optic material 4. Then, such varied laser beam emanating from material 4 impinges upon and is reflected by a dielectric mirror (not shown), which in turn provides a reflected laser beam.

A polarization beam splitter (not shown) is arranged at a selected position along the path that the incoming laser beam progresses. The reflected laser beam is separated by the polarization beam splitter to provide separated laser beams. Then, the separated laser beams are converted to respective electric signals (or potential signals) by photodiodes in a light detection unit 8 show in FIG. 3. The light detection unit 8 outputs two potential signals, which are then processed by a voltage measurement device 9. Thus, it is possible to perform measurement on the voltage of the external signal input via the electric input connector 2.

A terminal device 5 is arranged at an end of the conductive path 3 which is opposite to the end corresponding to the electric input connector 2. Using the terminal device 5, it is possible to perform measurement on the voltage of the signal transmitted through the low-impedance coaxial cable and the like. Termination of the conductive path 3 is made as shown in FIG. 3. That is, the conductive path 3 can be terminated by the termination device 5, which is equipped inside of the front panel 1 and includes a 50 Ohm resistor and capacitor in series. Or, it can be terminated by an external termination device 10, which is connected to the conductive path 3 via an electric output connector 6. By making adjustment on impedance of the electric circuit as described above, it is possible to avoid occurrence of measurement error due to interference and loss which are caused by reflection and transmission of electric signals.

Therefore, it is possible to introduce external measured electric signals, into the electro-optic sampling apparatus by merely connecting an external connector (not shown) to the electric input connector 2. Therefore, it is possible to transmit the measured electric signals onto the conductive path 3 such as the microstrip line on the printed-circuit board with high performance, for example. In addition, the electric-optic material 4 is fixed to the conductive path 3 in advance. For this reason, a constant contact area can be established between the electro-optic material 4 and the conductive path 3. Further, it is possible to suppress transmission loss of the electric signals to be about a prescribed low value.

As a result, the electro-optic material 4 is connected directly with the electric field that is caused by electric signals propagating through the conductive path 3. Due to an electro-optic effect such as the Pockel's effect, the electro-optic material 4 is varied in birefringence ratio in response to strength of the "connected" electric field. The laser beam is varied in polarization when incident on the electro-optic material 4. Such polarization-varied laser beam is reflected by the dielectric mirror and is then separated by the beam splitter, so that the separated beams are input to the photodiodes. Then, the photodiodes convert the beams to electric signals, which are input to the voltage measurement device 9. Thus, it is possible to perform high-precision measurement on the voltages of the high frecuency signals on the conductive path 3.

Incidentally, the electro-optic material 4 is configured to detect potential difference between end surfaces thereof. So, sensitivity in detection of the potential difference can be improved by connecting a grounded electrode to a first end surface of the electro-optic material 4, which is opposite to a second end surface brought in contact with the conductive path 3.

In addition, it is possible to arbitrarily change over impedance of the terminal device 5 in response to the circuit(s) connected to the electric input connector 2.

As described heretofore, the present embodiment has a configuration that the electro-optic crystal is mounted on the microstrip line. Instead of such a configuration, it is possible to employ another type of the microstrip line, such as GaAs board and InP board, which has an electro-optic effect by itself.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An electro-optic sampling apparatus comprising:

the apparatus having an interior space defining the inside thereof;

an electric input connector for inputting a measured electric signal, which is to be measured in voltage;

a conductive path inside the apparatus for transmitting the measured electric signal, wherein the conductive path has at least a bare portion at which a conductor of the conductive path is made bare;

an electro-optic material, which is fixed to the bare portion of the conductive path and whose birefringence ratio is varied in response to strength of electric field generated by the conductive path through which the measured electric signal transmits;

a termination device for electrically terminating the conductive path;

a light source for outputting a source laser beam toward the electro-optic material;

measurement means measuring how the laser beam is varied in polarization in response to variations of the birefringence ratio of the electro-optic material;

the apparatus being constructed as an oscilloscope; and further comprising a dielectric mirror for reflecting the laser beam which is varied in polarization in response to the variations of the birefringence ratio of the electro-optic material, so that the measurement means measures the source laser beam voltage with respect to the reflected laser beam.

2. An electro-optic sampling apparatus according to claim 1, further comprising:

means for converting the source and reflected laser beams to electric signals representing potentials, so that the measurement means measures the variation in polarization based on the electric signals.

3. An electro-optic sampling apparatus according to claim 1, wherein the electro-optic material is made of $Bi_{12}SiO_{20}$ to provide electro-optic effect such as Pockel's effect.

4. An electro-optic sampling apparatus according to claim 1, wherein the electro-optic material is made of $Bi_{12}SiO_{20}$ to provide electro-optic effect such as Pockel's effect.

5. An electro-optic sampling apparatus according to claim 1, wherein the conductive path corresponds to a microstrip.

6. An electro-optic sampling apparatus according to claim 2, wherein the conductive path corresponds to a microstrip.

* * * * *

UNITED STATES PATENT AND TRADEMARK OFFICE
CERTIFICATE OF CORRECTION

PATENT NO. : 6,683,447 B1
DATED : January 27, 2004
INVENTOR(S) : Yoshiki Y. et al.

It is certified that error appears in the above-identified patent and that said Letters Patent is hereby corrected as shown below:

<u>Title page, Item [54] and Column , lines 1-2,</u>
Title, delete "ELECTRO-OPTIC APPARATUS FOR MEASURING SIGNAL POTENTIALS" and substitute -- ELECTRO-OPTIC SAMPLING APPARATUS --.

Signed and Sealed this

Seventeenth Day of August, 2004

JON W. DUDAS
*Acting Director of the United States Patent and Trademark Office*